United States Patent [19]

Hutchison et al.

[11] 4,132,856

[45] Jan. 2, 1979

[54] PROCESS OF FORMING A PLASTIC ENCAPSULATED MOLDED FILM CARRIER CML PACKAGE AND THE PACKAGE FORMED THEREBY

[75] Inventors: Robert V. Hutchison, Valley Center; John A. Nelson, San Diego, both of Calif.

[73] Assignee: Burroughs Corporation, Detroit, Mich.

[21] Appl. No.: 855,286

[22] Filed: Nov. 28, 1977

[51] Int. Cl.² .............................................. H05K 5/06
[52] U.S. Cl. ........................... 174/52 PE; 174/16 HS; 174/52 FP; 29/588; 357/72; 357/81
[58] Field of Search .......... 174/16 HS, 52 FP, 52 PE; 357/81, 72; 29/588, 574, 577 C

[56] References Cited

U.S. PATENT DOCUMENTS

| | | | |
|---|---|---|---|
| 3,484,534 | 12/1969 | Kilby et al. | 174/52 FP X |
| 3,611,061 | 10/1971 | Segerson | 174/52 FP X |
| 3,689,683 | 9/1972 | Paletto et al. | 174/52 PE |
| 3,922,712 | 11/1975 | Stryker | 357/81 |
| 3,930,114 | 12/1975 | Hodge | 174/16 HS |
| 4,007,479 | 2/1977 | Kowalski | 174/52 FP |

Primary Examiner—J. V. Truhe
Assistant Examiner—D. A. Tone

Attorney, Agent, or Firm—Joseph R. Dwyer; Mervyn L. Young; Kevin R. Peterson

[57] ABSTRACT

A process of packaging an electronic integrated circuit which comprises a film carrier having metallized connector leads formed thereon to provide the connector leads for the integrated circuit (a hermetically sealed bumped die); gang-bonding the die to said leads; preferably testing the die and bounding thereof for electrical performance, continuity, etc.; placing a metal heat sink having a raised die attach area and a pair of pedestals coextensive with said film carrier into a transfer mold with the leads remaining planar; epoxy bonding said die to said die attach area concurrently soldering selected leads to said pedestals; and completely encapsulating said die in plastic while in said mold allowing said plastic to flow freely on both sides of the die attach area and over most of said heat sink to prevent warpage of the package when said plastic and metal cools but leaving the outer edges of said leads, not connected to said pedestals, open and free of plastic.

In one embodiment, a leadless type package is formed by the process with the heat sink having means for liquid or change of state cooling, and in another embodiment an air cooled leadless type package is formed by the process.

15 Claims, 12 Drawing Figures

PROCESS OF FORMING A PLASTIC ENCAPSULATED MOLDED FILM CARRIER CML PACKAGE AND THE PACKAGE FORMED THEREBY

BACKGROUND OF THE INVENTION

This invention relates in general to the packaging of integrated circuits and in particular to the method of encapsulating a hermetically sealed integrated circuit in plastic, utilizing the latest of conductor lead bonding, plastic and film technology, and to a new and improved plastic encapsulated hermetically sealed integrated circuit package incorporating this technology.

The packaging of integrated circuits, commonly referred to as chips or dice, has been the subject of much study. The art teaches several ways of packaging chips, but perhaps the most predominant process includes as part of the process the bonding of lead wires from the chip to a metal leadframe. This process is expensive, time-consuming, error-prone and requires the utmost care in handling to prevent breakage due to the fragility of the wires, thereby increasing the cost per package considerably.

To date, therefore, there is a need for a reliable, low-cost packaging process, utilizing automatic techniques, taking advantage of present day hermetically sealed chips and taking advantage of gang-bonding techniques and plastic technology, to form a hermetically sealed plastic encapsulated integrated circuit package.

One of the advantages of such a packaging process is the reduction in the cost of packaging such chips by:

1. utilizing industry standard 35 mm film with sprocket holes which are precisely located and thus can be used as locating holes to index the various elements that make up the package during the process;
2. utilizing such a film, the patterns of connector leads formed thereon are supported during handling thus eliminating the danger of damage due to fragile connections, etc;
3. utilizing such a film, the hermetically sealed bump die is indexed into place relatitve to the film while the film is still co-planar and while so indexed, is gang-bonded thereto;
4. utilizing such a film with the bonded die being supported by the film, the film serves as a carrier for safer handling of both the connector leads and die;
5. utilizing such a film as a carrier and while so supported on said film, the die and the gang-bonded connections of the connector leads thereto are tested, thus eliminating the cost of the remaining steps in the process otherwise involved, if testing the entire package were to await the final step in the process;
6. providing a metal heat sink having means for supporting the die and the ground straps so that the carrier and leads remain co-planar throughout, thus eliminating the costly prior art step of bending the leads, as for example, bending the ground straps to the plane of the heat sink; and
7. utilizing a single transfer mold which positions the die and the film together with the heat sink so that the die can be accurately indexed and thermally and mechanically connected to the heat sink, so that the ground straps are pulse-soldered to the heat sink in one step, with the sprocket holes again used as locater holes, and, thereafter, without removal from the same mold, selectively encapsulating the assembly in plastic.

It should also be apparent from the foregoing that there are a number of aspects of this invention which represent advantages over the prior art, in addition to the reduction of costs as represented by the steps set forth above, which are:

there is a one-step bonding of the die to the connector leads and thus this lead interface step becomes essentially the electronic package with direct electrical communication established with the chip, the film carrier and its attached die are in one step, electrically attached to the heat sink and, in one step, made integral with the heat sink by the plastic encapsulation.

Most importantly is the reduction in the number of electrical interfaces, i.e., the one step gang-bonding of the die of the film carrier (as distinguished from individually bonding wire leads from the die to a metal leadframe) and the one step connection of the film carrier and die to the heat sink. It is well known that any reduction in interface connection steps improves the reliability of the circuit since each interface required affects the mean time before failure (MTBF) of a device. With this invention the reliability of these packages is improved considerably.

From the foregoing, it should also be apparent that also involved in this invention is a new and improved plastic encapsulated hermetically sealed integrated circuit or die, of the leadless package type, having a selectively configured heat sink with means of elevating the die above the main surface or plane of the heat sink and with means for elevating the connection of the ground straps so that all the lead conductors still disposed on a film in said package are co-planar, and forming a reliable circuit ready for utilization in an electronic device.

SUMMARY OF THE INVENTION

The process of packaging an electronic circuit which meets the advantages set forth above comprises, in summary, the following:

providing a film carrier having patterns of metallized connector leads formed thereon to provide the leads for an individual integrated circuit, (each lead pattern fanning in from the edges of the film, adjacent to the film sprockets, to within a centrally located area for connection to a hermetically sealed die);

gang-bonding the bumps on the hermetically sealed bumped die to the ends of said leads (extending within said aperture) thus providing a carrier which may be handled, as such, during the assembly process;

preferably testing the die and the bonding thereof for electrical functionality, continuity, etc., before proceeding further in the process to eliminate cost by eliminating further steps on those dice and/or bonds found to fail such tests;

providing a metal heat sink having means for disposing the film carrier co-planar while the latter is being attached to the heat sink. In one embodiment, this metal heat sink is generally thin, rectangular, and coextensive with the size of the lead patterns on the carrier, and the means for holding the carrier co-planar comprises a raised die attach area being of a size to not only support the die but to permit liquid plastic to flow on both sides of the die attach area to prevent warping of the package when the plastic and heat sink cool. The other embodiment of the metal heat sink comprises a finned metallic heat sink of the air cooled type with a means similar to the first embodiment on which the film carrier can be disposed coplanar;

placing said heat sink and a portion of said film carrier including said die in a mold fixture and epoxy bonding said die to said die attach area and concurrently reflow soldering selected connector leads as ground straps to said pedestals;

completely encapsulating said die in plastic while in said mold fixture, the outer edges of said leads being open and free of plastic, and finally, testing said package for electrical performance, continuity, etc.

The package according to one embodiment of this invention comprises a plastic encapsulated hermetically sealed die bonded to a relatively thin heat sink, with ground straps connected to said heat sink and connector leads extending from said die and terminating in connector pads at the outer edges of said package, said heat sink having die attach area and a pair of pedestals which space the die and the ground straps from the remainder of the top plane surface of the heat sink, so that said connector leads and ground straps are co-planar, said plastic covering the die and the bottom side of the die attach area and all but the connector pads and a portion of the heat sink for attachment to a liquid or change of state cooling means to provide a leadless encapsulated integrated circuit package.

The package according to another embodiment of this invention comprises a plastic encapsulated hermetically sealed die bonded to a heat sink, and like the prior embodiment, the die carrier becomes part of the package with the ground straps connected to the heat sink and the connector leads extending from said die to terminate in connector pads on the outer edges of the package. Also, like the first embodiment, the heat sink has a die attach area and a pair of pedestals which space the die and the ground straps from the remainder of the top plane surface of the heat sink so that the connector leads and ground straps are co-planar and plastic covers the die leaving all but the connector pads and a portion of the heat sink for attachment to a recepticle to provide a leadless air cooled integrated circuit package.

BRIEF DESCRIPTION OF THE PREFERRED EMBODIMENT

Figure 6:
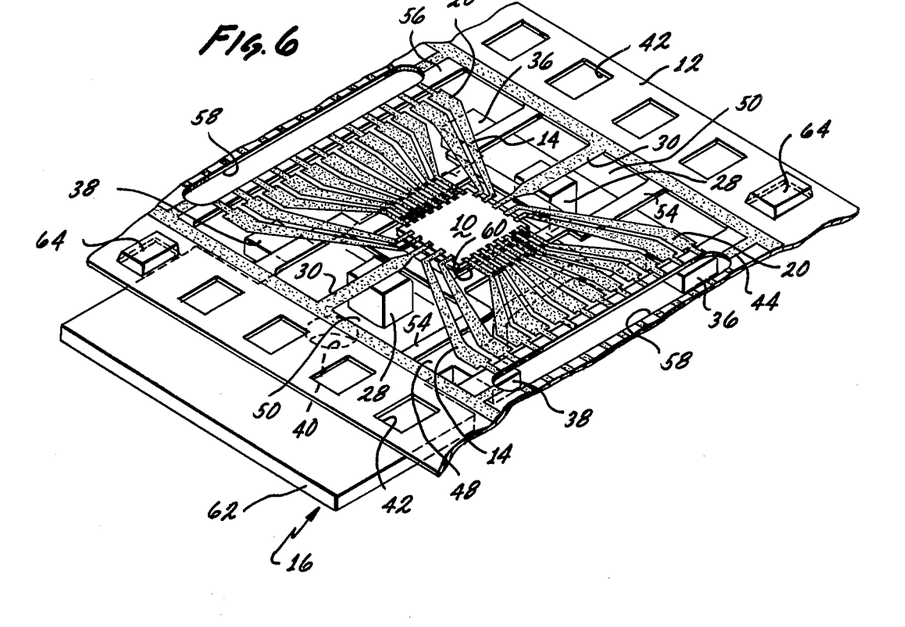
FIG. 6 is a perspective view of the film carrier and heat sink of FIGS. 4 and 5 positioned in a transfer mold (only a portion of the latter being shown) for forming the encapsulated integrated circuit package according to the invention.
Figure 7:
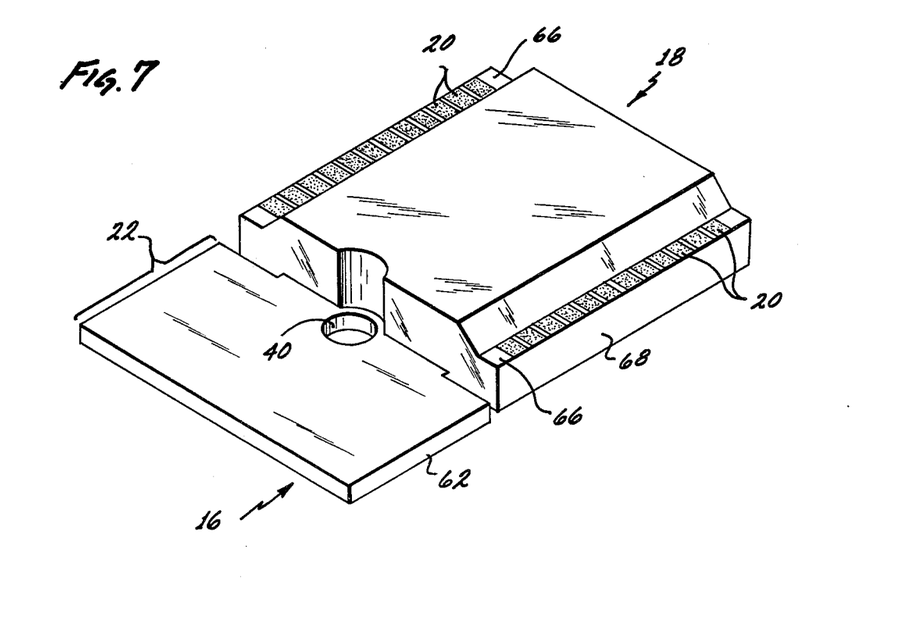
FIG. 7 is a perspective view (top) of the encapsulated integrated circuit package formed according to the invention.
Figure 8:
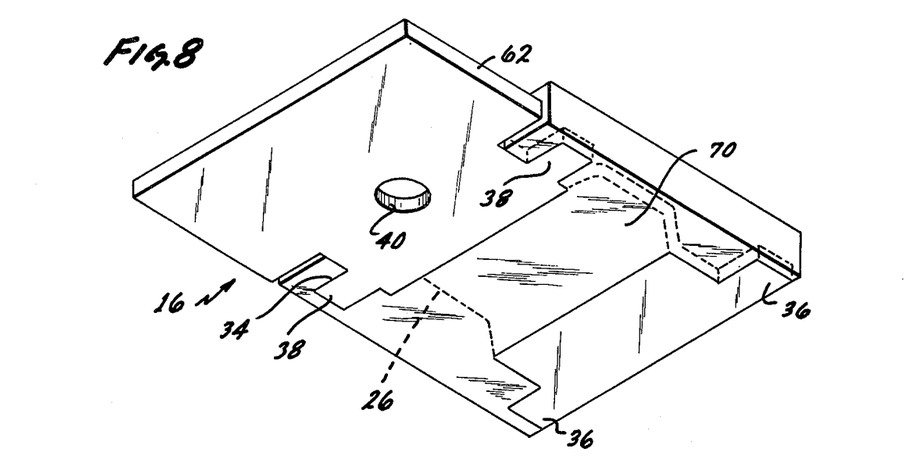
FIG. 8 is a perspective view (bottom) of the integrated circuit package of FIG. 6, partly in phantom, to show the heat sink in the package.

As an overview of the teachings of this invention, it is pointed out that, in such a sequence, a hermetically sealed bumped die 10 (FIGS. 3–5) is mounted on a film carrier 12 (FIGS. 2, 3–5) containing connecting leads 14 and mounted on a performed heat sink 16 (FIGS. 1, 4–8) and finally encapsulated in plastic to form an integrated circuit package 18 (FIGS. 7, 8). The package 18 is a leadless package and includes a plurality of terminals or pads 20 (FIGS. 2, 4–8) for connecting the die with other electrical components and is provided with a portion of the heat sink member 16 exposed, as shown at 22, adapted to be clamped into a connector and to a heat transfer carrier such as a liquid-cooled frame for conducting away the heat generated by the integrated circuit during operation. Another embodiment of the package 18a (FIGS. 9–11) is a leadless air cooled package and includes connecting leads 14a and is mounted on a heat sink 16a which is provided with fins and is adapted to be clamped onto a connector with the fins subject to air flow for cooling. Finally, FIG. 12 is a flow chart showing the steps of the process to form an integrated circuit package such as disclosed in FIGS. 1–11.

Now, in more detail, as more clearly seen in FIG. 1 and FIGS. 4–8, the heat sink 16 of this embodiment is a relatively thin, more or less rectangular metal member, preferably of copper plated with nickel and tin, or other suitable heat conductive material but of sufficient thickness to support the package and formed preferably by powdered metallurgy. The heat sink 16 is provided with a die attach area 24, slightly to the right of center viewed in FIG. 1, but otherwise centrally located lengthwise of the heat sink and extending across the entire width of the heat sink in that area so as to provide a top surface 26 which effectively elevates the bottom of the die 10 from the remainder of the top surface of the heat sink so that the film carrier 12 and its leads remain planar. The heat sink 16 is also formed with two pedestals 28, adjacent the die attach area but on each side thereof, the tops of which are higher than the die attach area top surface 26, to permit ground straps 30, originally formed as part of the leads 14 on the film carrier 12, to remain co-planar with the other leads connected to the bumped die and terminating at pads 20. The heights of the pedestals relative to the height of the die attach area depend, of course, on the thickness of the die being mounted and the thickness of the adhesive used to attach the die to the die attach area. The heat sink 16 is also provided with two pairs of notches, 32 and 34, formed as the blank is formed into the heat sink; notches 32 taken together define the width of the die attach area 24 and are of a length substantially equal to the length of the die attach area 24 plus one adjacent pedestal while the notches 34 are of a shorter length. Both notches defining pairs of lugs 36 and 38. These lugs are substantially equal in width and length and provide anchors for the plastic used to encapsulate the die and the package leads as will be clear hereinafter. Finally, the heat sink 16 is also provided with an aperture 40 which is simply a locating hole for connecting the package to an electrical connector in which the package will be mounted. If further information concerning this last-mentioned locating hole 40 is required, reference is made to the U.S. Pat. to Braun, et al., No. 3,946,276, dated Mar. 23, 1976, entitled, "Island Assembly Employing Cooling Means for High Density Integrated Circuit Packaging".

Figure 1:
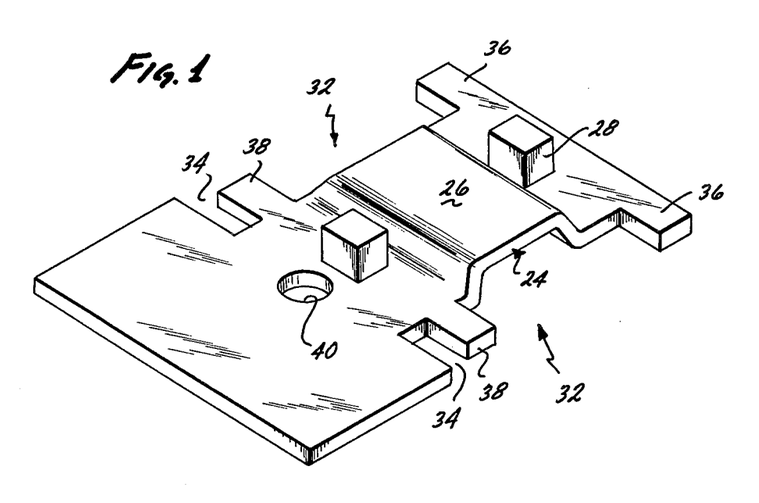
FIG. 1 is a perspective view of the heat sink formed according to this invention.
Figure 2:
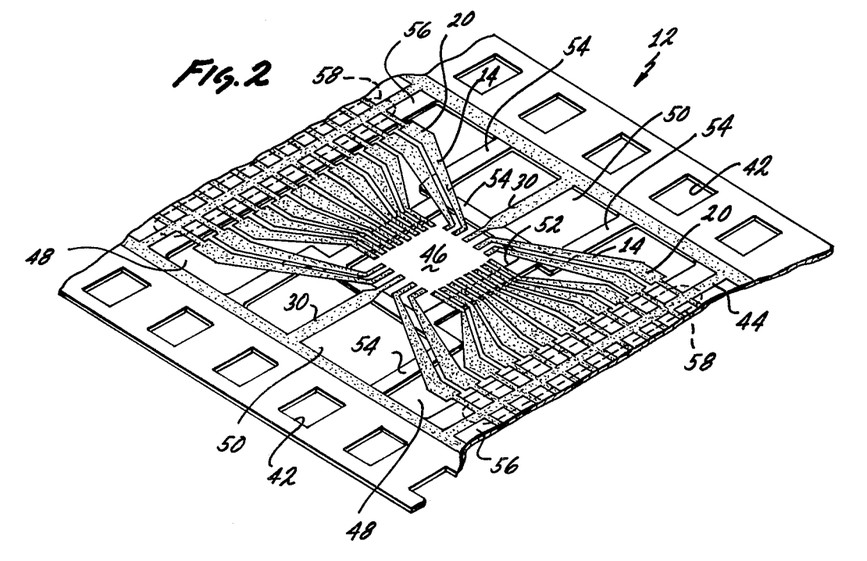
FIG. 2 is a perspective view of a portion of a film carrier with integrated circuit package connector leads thereon and formed according to this invention.

FIG. 2 shows that the film carrier 12, per se, is an industry standard size 35 mm film having standard sprocket holes 42 formed on each edge in the conventional manner with consecutive frames or patterns of conductor leads 14 which fan inwardly from the outer rectangular leadframe 44, to and through the edges to form a centrally located die aperture 46. In the embodiment shown, there are twenty-six leads with twenty-four of such leads having outer ends wider than inner ends in the area of the die aperture 46 to form the aforementioned pads 20 and two relatively wide leads whose ends are also narrow in the area of the die aperture to form the aforementioned ground straps 30 which will ultimately be connected to the heat sink 16 via the pedestals 28.

While the process of forming the film carrier 12 and the patterns thereon will not be described in detail since it is within the state of the art to suitably mask and etch connector lead patterns on a film carrier, (Kapton) it is to be pointed out, however, that the film is first apertured in a pattern, i.e., a pair of relatively long, rectangular apertures 48, a pair of relatively short apertures 50 with both pairs bordering rectangular film aperture 52 (within which is defined the die aperture 46 formed by the leads 14) all of which apertures define relatively narrow web segments such as 54 within wider end segments 56; all of which segments support leads 14. These apertures 48, 50 and 52 are formed in the carrier before a copper layer is laminated to the film from which the leads are formed by a conventional etching technique. Thus, not only do the apertures 48, 50 and 52 form webs of film to support the leads 14 but they also perform another important function, namely, they form areas to permit plastic to flow therethrough during the encapsulation step. In connection with this latter step, it is to be noted that the pads 20 are free of film for adhesion to the plastic rather than to the film in the final package.

Figures 3, 4, 5:
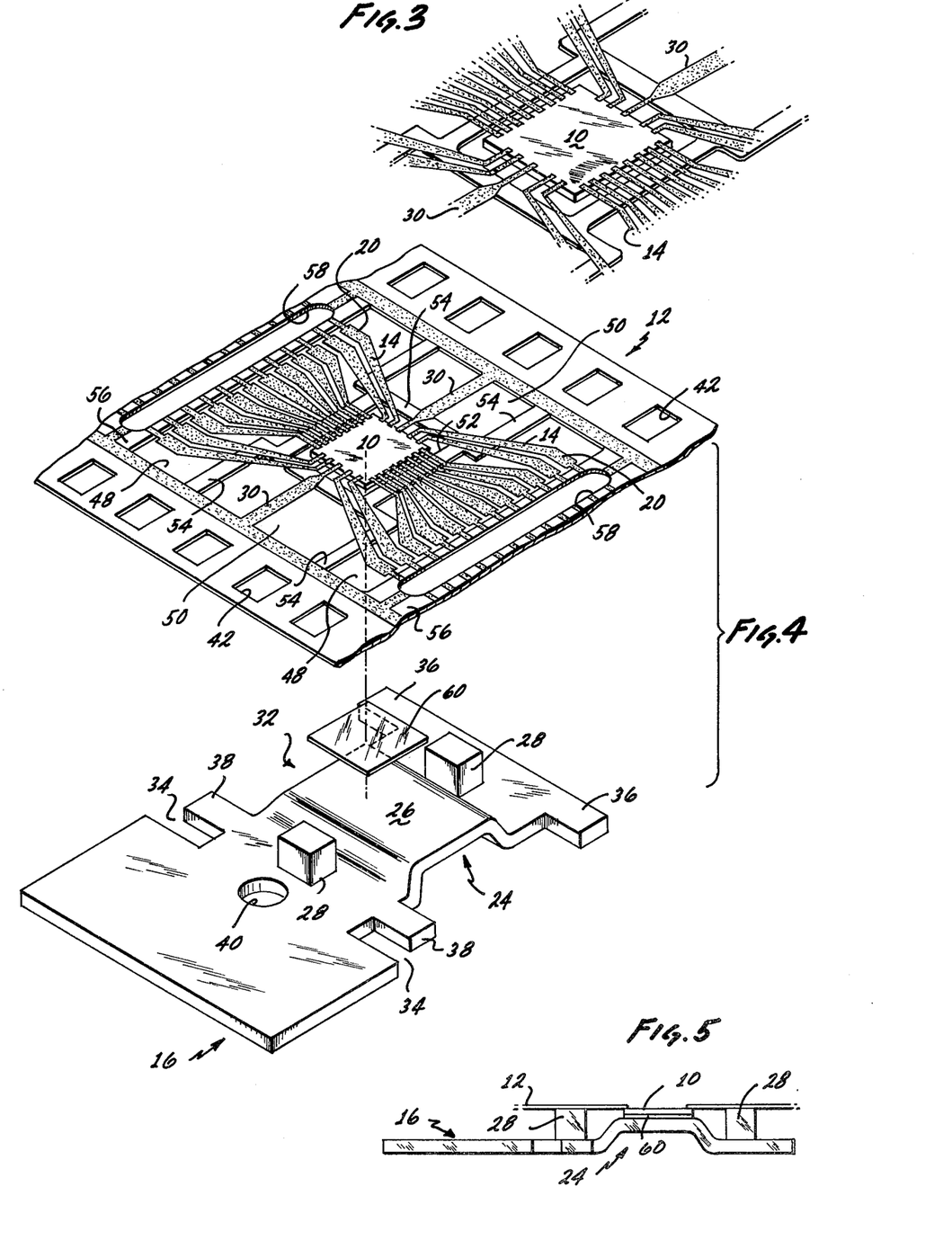
FIG. 3 is a perspective view of the central portion of the film carrier of FIG. 2 slightly enlarged to show the package leads attached to the integrated circuit (die)
FIG. 4 is an exploded perspective view showing the film carrier with the integrated circuit attached and shown relative to the heat sink of FIG. 1.
FIG. 5 is a cross-sectional view of the film carrier and heat sink of FIG. 4 but without the transfer mold.

Thus far described, the film carrier 12 with a plurality of frames or patterns of connector leads thereon, having reel-to-reel capability, will receive the bumped dies 10, one for each of the patterns and will be placed in a gang-bonding machine which utilizes the sprocket holes 42 to index the positions of the dies and the film carrier and, while in this station, the inward ends of the leads are gang-bonded, i.e., bonded all at the same time to the bump die. This is shown in FIG. 3. Each of the individual hermetically sealed bump dies 10 are disposed on a glass plate (not shown). Die 10 in FIG. 3 is one of a plurality of such dice which have been sorted and separated from one another by sawing while still adhered to the glass plate by a suitable wax and the bonding operation is at a temperature which melts the wax holding the bump dice to the glass plate, thus permitting the die to detach from the glass plate so that the connected leads hold the bumped die onto the film carrier.

With the bumped die 10 on the film carrier 12 and electrically connected to the individual leads of the pattern, the electrical continuity of the connections made by this gang-bonding step, as well as the functionality of the die itself, can be tested at this time before proceeding further with the formation of the package. As aforesaid, this can be accomplished since the film carrier supports the connector leads. To electrically isolate the leads from one another for this continuity test, the wider webs 56 are through-punched in a configuration such as shown at 58 (in phantom) in FIG. 2 and shown as an elongated slot in FIGS. 4 and 5 by a suitable punch (not shown). Note that a sufficient amount of the ends of the leads and webs 56 remain to support the leads in the carrier for testing and for the remainder of the process. This distinguishes this technique from the metal leadframe and wire-bonding technique of the prior art, thereby not permitting electrical isolation of the individual leads. Thus, in this invention, any die or any bond connections which show failure on test can be rejected before proceeding further in the process toward final testing. This is an important cost-saving advantage over the prior art. Furthermore, it can be appreciated that with the leads still forming a part of the carrier and with the bump die attached thereto, the handling of the dice and leads during these tests and in later steps in the process is greatly facilitated.

The next step is shown in FIGS. 4-6 with FIGS. 4 and 5 showing the relationship of the heat sink 16 relative to the film carrier 12 with an electrically insulating but thermal conducting adhesive 60 which, as in FIG. 5, will be placed between on top surface 26 of the die attach area 24 and the bottom surface of the die 10 to secure the die to the die attach area. A material suitable for this purpose is BeO filled epoxy sold under the trademark E-480 Berlon by National Beryllia Company.

FIG. 6 shows the heat sink 16 inserted in a transfer mold, schematically shown as 62, with one frame of the pattern of the film carrier 12 and attached die 10 disposed thereover.

Again, one advantage of using an industry standard film is that the sprocket holes 42 can be used to index these components, which indexing is shown by the locating pins 64 on the top of the transfer mold. While in this position, the die is attached to the top surface 26 of the die attach area 24 by the epoxy resin adhesive 60 and, at the same time, the ground straps 30 are pulse-soldered to the tops of the pedestals 28. Again, it is important to note that the tops of the pedestals and the top surface of the die attach area relative to the top surface of the main portion of the heat sink is to accommodate the thickness of the die (and the epoxy resin 60) relative to the plane of the film so that the ground straps and connector leads remain co-planar, thus reducing any stress or strain on this conductor lead and, at the same time, eliminating all metal-forming steps normally required if the ground straps were to be attached to the main plane of the heat sink. This latter step, now eliminated, as heretofore been found to be difficult because of the normal resiliency of the metal which opposed attachment to the heat sink as it was being bent downwardly and thus tended to cause an open circuit.

After the die 10 has been attached to the heat sink 16 and the ground straps 30 have been soldered thereto, the mold 62 is closed and the epoxy resin is introduced into the mold. As shown in FIGS. 7 and 8, the resin completely encapsulates the die 10, penetrates the film carrier through apertures 48 and 50 and between the leads 14 and flows under the die attach area and around the lugs 36 and 38 and further forms ledges 66 on each side of the heat sink to support pads 20. Thus, the pads 20 and portion 22 of the heat sink are free to plastic and the edges are generally coextensive with the outer edges of the portion 22. The transfer molding compounds usable to practice this invention are of the Novolac-2 class and sold under the trademarks Morton 410B-21 or 85 by the Morton Chemical Company of Woodstock, Illinois; Allied Chemical 2969B by the Allied Chemical Company of Los Angeles, California; and Hysol MG17-F by the Hysol Division of Dexter Corporation of Los Angeles, California.

The formation of the ledges 66 and the outer side walls (one side wall 68 being shown in FIG. 7) are, of course, formed by the mold cavity but most importantly in this process is the flow of the plastic over the die attach area, die, ground strap and leads (except pads 20) and under the die attach area to fill the cavity 70 formed by the die attach area (FIG. 8). This configuration of plastic and metal minimizes the warpage of the package when the metal and plastic cool which warpage is due to the different coefficients of expansion. This is important when it is realized that the package is to be inserted in a connector having electrical connectors which engage the pads 20 and any warpage of the package provides the possibility of an open connection between one or more of the pads 20 and their mating electrical connectors.

Thus, after final curing and trimming the carrier, deflashing, and cleaning, the package is ready for final testing, this testing being for final electrical functionality and to check for any open circuits that may have been formed subsequent to the testing while the bumped die was part of the film carrier.

Finally, from the foregoing, it can be seen that according to the invention, the latest techniques in film carrier technology, plastic technology, and integrated circuit technology have been utilized in the process to provide a less expensive but completely acceptable high-performance, hermetically sealed, plastic encapsulated leadless integrated circuit package. As to the circuit package itself, it should be noted that not only are all the connector leads co-planar but the leads were not removed from the film so that the film carrier remains part of the package. And finally, with the particular configuration of the heat sink, the heat sink is literally brought up to the die itself for maximum thermal conductivity, rather than attempting to lower the die on a planar heat sink, with all the attendant problems of bending the connector leads, etc., as in the prior art. This configuration of the heat sink is actually a reversal in concept of the prior art heat sinks — the heat sink is brought, so to speak, to the die rather than bringing the die to the heat sink for thermal conductivity.

Figure 9:
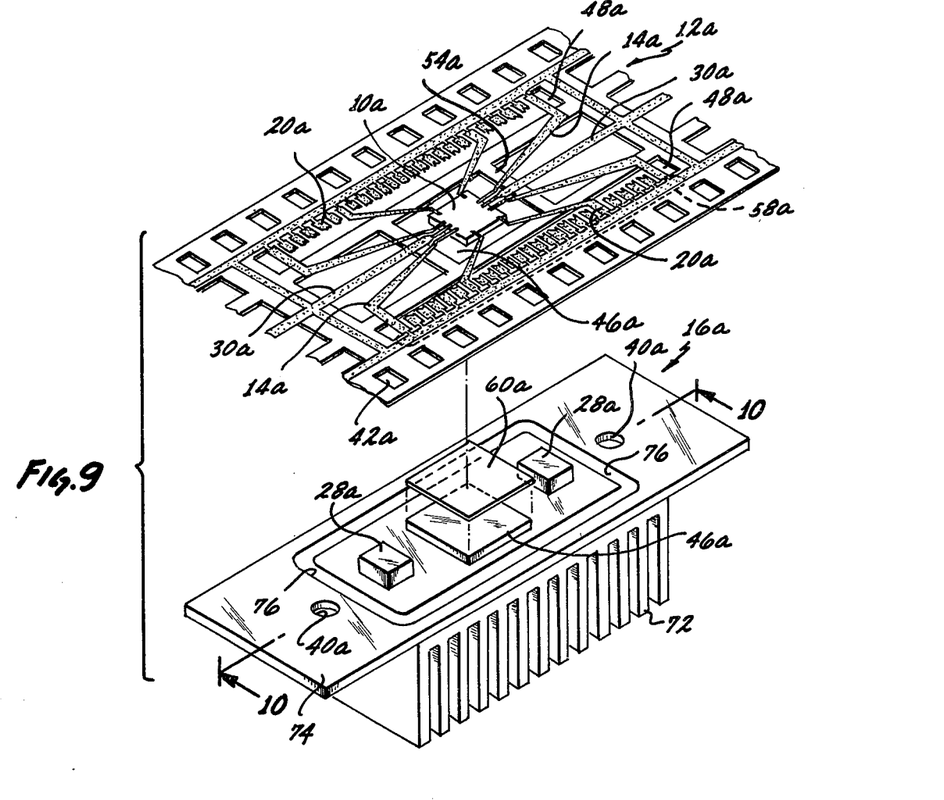
FIG. 9 is an exploded view comprising a perspective view of the air cooled heat sink together with a perspective view of a portion of a film carrier with integrated circuit package connector leads thereon and showing the package leads attached to the integrated circuit (die)
Figure 10:
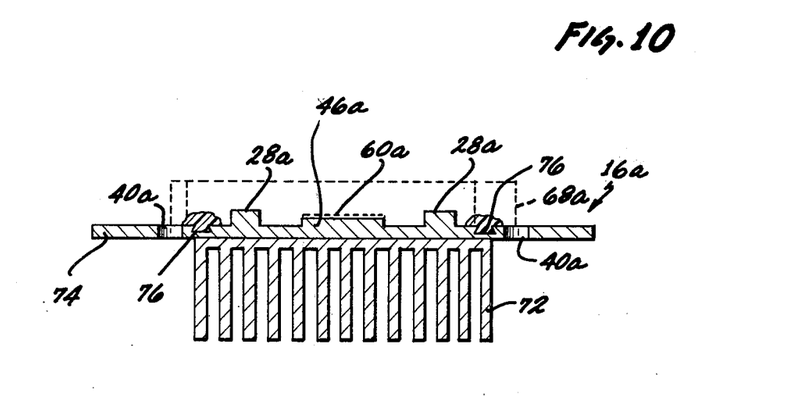
FIG. 10 is a cross-sectional view of the heat sink taken along line 10—10 of FIG. 9 to show one form of locking the plastic molding to the heat sink.
Figure 11:
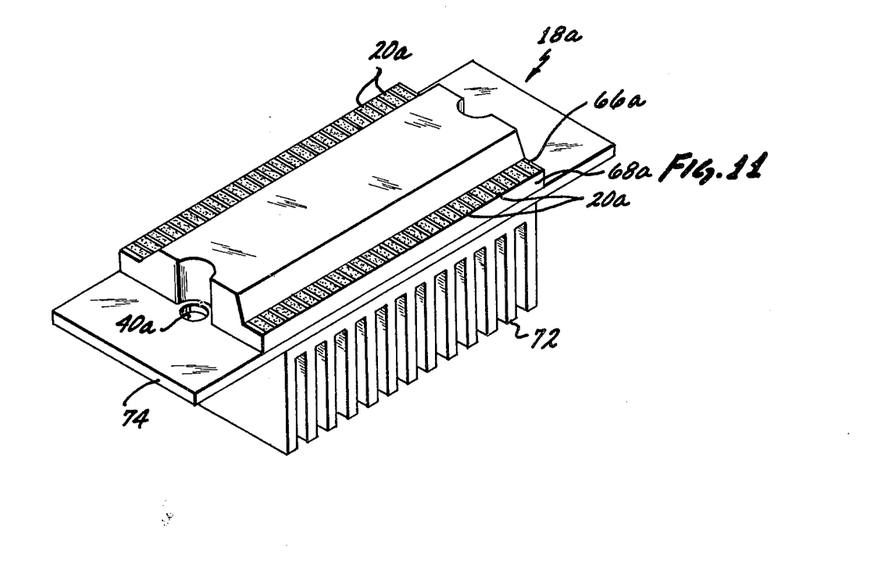
FIG. 11 is a perspective view of the encapsulated integrated circuit package formed according to the invention.
Figure 12:
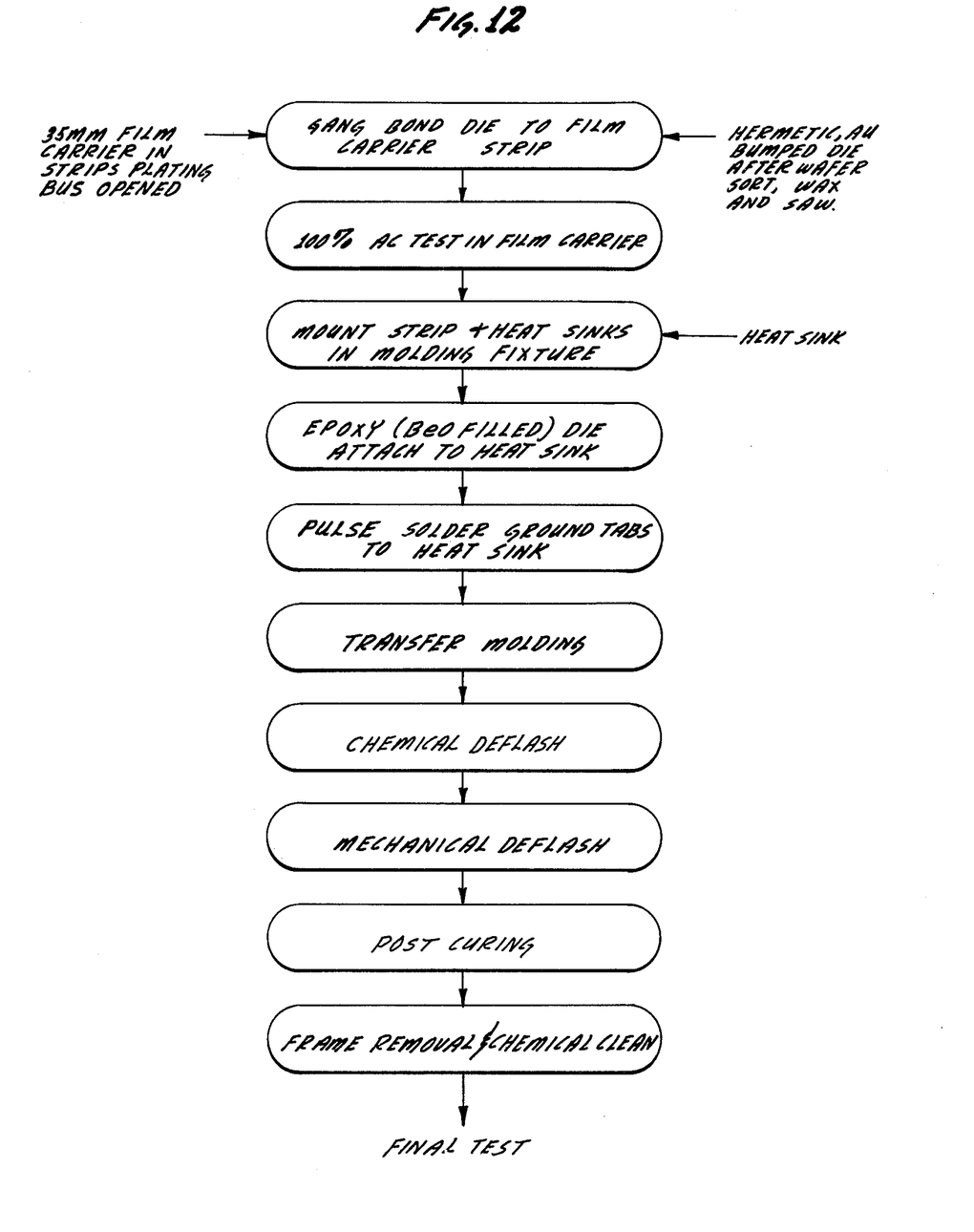
FIG. 12 is a flow chart showing the steps of the process of forming an encapsulated integrated circuit package according to the invention.

FIGS. 9-11 show a preformed heat sink member 16a with fins 72 for heat dissipation by air cooling and also showing a die 10a on a film carrier 12a. The heat sink is of aluminum and may be of one piece or may be a single flat, rectangular top piece such as 74 with the fins 72 brazed or otherwise connected to the top piece. To avoid repeating and to shorten the description of this embodiment, those items having the same function as described in connection with the other embodiment of this invention, above, are given the same reference numerals but with a suffix "a". Thus, the film carrier 12a with the bonded bumped die 10a are attached to the heat sink in the same manner as previously described, i.e., the die is attached to the die attach pad 46a by the epoxy adhesive 60a, and the ground straps 30a are pulse-soldered to the pedestals 28a and, as in the prior embodiment, the heat sink is then placed in a transfer mold (not shown) to completely encapsulate the die and a portion of the leads 14a to form air cooled leadless type package with the pads 20 exposed as shown in FIG. 12.

It is to be noted that the film carrier, as in the prior embodiment, is held co-planar in the transfer mold by reason of the configuration of the heat sink and also that the film carrier becomes part of the encapsulated package. A point that should not be overlooked, also, is that the die being attached to the film carrier may be tested for functionality, continuity, etc., before encapsulation as above described, since the leads 14a and the die 10a can be electrically isolated from the remainder of the carrier by a punch to form a through-punch slot as at 58a and by cutting the ground straps to free them from the plating bus as described in conjunction with FIGS. 1-8.

Certain things in this embodiment are to be noted, however, as differing over the prior embodiment. In the other embodiment the die attach area was a raised portion substantially the width of the heat sink and the plastic was encapsulated on both sides of the die attach area and the lugs 36 and 38 so that the pad area would be substantially flat to provide good contact for the receptacle or connector. This was to accommodate the different coefficients of expansion of the materials. This also served to lock the resin to the heat sink. Thus, the other embodiment showed how a heat sink, made of copper and plated with nickel and tin, can be made compatible with an epoxy resin having a different coefficient of expansion. On the other hand, in the second embodiment of this invention, the heat sink is made of aluminum, coated with nickel and tin, which has a coefficient of expansion generally the same as the epoxy resin. However, with the elimination of the cavity 70 and lugs 36 and 38 to lock the encapsulating plastic to the heat sink in this embodiment, another means for locking the plastic to the heat sink had to be provided. Thus, reverse walled V-grooves 76 which surround the area generally prescribed by the die attach area and the pedestals are selected as one means for locking the plastic to the heat sink. These grooves are more clearly shown in cross-section in FIG. 10.

Finally, it should be pointed out that the carriers 12 and 12a represent examples of carriers for different types of dice — die 12 being of the MSI type requiring 24 leads and pads while the die 12a is of the LSI type requiring 50 leads and pads. Only a few of the leads are shown in FIG. 9 while all of the pads are shown in FIG. 11.

What is claimed is:

1. In the art of manufacturing integrated circuit packages which includes a heat sink with die attach areas and a cavity formed therebeneath and at least one pedestal to receive the integrated circuit to be mounted thereon, the steps of:

affixing said integrated circuit to a film carrier containing a pattern of connector leads, and encapsulating most of said heat sink and all of said integrated circuit as well as most of said film carrier in plastic leaving only the ends of said connector leads free of encapsulating plastic while maintaining said connector leads co-planar with one another.

2. The art as claimed in claim 1 wherein said cavity is filled with plastic during said encapsulation step.

3. The art as claimed in claim 2 wherein the step of affixing said integrated circuit to said film includes connecting said integrated circuit to said connector leads so that said connector leads hold said integrated circuit on said film.

4. In the art as claimed in claim 3 wherein before the step of encapsulating, said integrated circuit and said connector leads are tested for operability.

5. The art as claimed in claim 3 wherein before the step of encapsulation, said film carrier is placed over a portion of said heat sink with said integrated circuit coextensive with its said heat sink member, and said integrated circuit is connected to said die attach area for thermal conductivity therebetween.

6. In the art as claimed in claim 5 wherein before the step of encapsulation, at least one of said connector leads is connected to said at least one pedestal to form a ground between said integrated circuit and said heat sink.

7. In the art as claimed in claim 6 wherein the step of forming said ground is taken concurrently with the step of affixing said integrated circuit to said die attach area.

8. In the art of manufacturing integrated circuit packages which includes a relatively thin heat sink with a die attach area formed thereon and a cavity therebeneath the steps of:
   affixing said integrated circuit to a film carrier having sprocket holes and containing a pattern of connector leads which fan inwardly from the outer edges of said film carrier to a centrally located aperture by connecting said integrated circuit package to said leads within said aperture,
   placing said film carrier over a portion of said heat sink with said integrated circuit on said die attach area and utilizing the sprocket holes to index said film carrier relative to said heat sink,
   connecting said integrated circuit to said die attach area for thermal conductivity therebetween,
   electrically connecting at least one of said leads to said heat sink to form a ground therebetween,
   encapsulating most of said heat sink member, all of said integrated circuit in plastic and said cavity leaving only the outer ends of said connector leads free of plastic to form connection pads to other electronic devices.

9. A plastic encapsulated package for an integrated circuit comprising:
   a metallic heat sink having an upper surface provided with a die attach area for receiving an integrated circuit thereon and spacing said integrated circuit from said upper surface,
   a pattern of connector leads running outwardly from said die attach area and forming connector pads, said pattern of leads being held in a film carrier,
   means for interconnecting individual connector leads of said pattern with said integrated circuit,
   means for interconnecting said integrated circuit with said heat sink to provide a common ground therebetween electrically insulated from said other individual connector leads, and
   means for encapsulating said integrated circuit and a major portion of said heat sink as well as a portion of said connector leads in plastic leaving only the ends free of said plastic for connecting said integrated circuit to other electronic devices.

10. The plastic encapsulated integrated circuit package as claimed in claim 9 wherein said heat sink has a cavity formed beneath said die attach area filled with plastic.

11. The plastic encapsulated integrated circuit as claimed in claim 10 wherein all of said connector leads are co-planar.

12. The plastic encapsulated integrated circuit package as claimed in claim 11 wherein said metallic heat sink member also includes fins for air cooling.

13. The plastic encapsulated integrated circuit package as claimed in claim 9 wherein said means for interconnecting said integrated circuit with said heat sink member to provide a common ground includes pedestals to which said connector leads are connected.

14. The plastic encapsulated integrated circuit as claimed in claim 13 wherein said means for encapsulating said integrated circuit also penetrates a portion of said heat sink member to lock said integrated circuit and connector leads together as a unitary package.

15. The plastic encapsulated integrated circuit package as claimed in claim 13 wherein said metallic heat sink member, said die attach area, and said pedestals are all formed of one piece of metal.

* * * * *